United States Patent
Manian et al.

(10) Patent No.: US 11,128,332 B2
(45) Date of Patent: *Sep. 21, 2021

(54) EFFICIENT FRONT END MODULE

(71) Applicant: Ethertronics, Inc., San Diego, CA (US)

(72) Inventors: Vahid Manian, San Diego, CA (US); Hamid Eslami, San Diego, CA (US); Norik Dzhandzhapanyan, San Diego, CA (US)

(73) Assignee: Ethertronics, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/679,413

(22) Filed: Nov. 11, 2019

(65) Prior Publication Data

US 2020/0076461 A1    Mar. 5, 2020

Related U.S. Application Data

(63) Continuation of application No. 16/021,299, filed on Jun. 28, 2018, now Pat. No. 10,476,541.
(Continued)

(51) Int. Cl.
*H04B 1/18* (2006.01)
*H03F 3/193* (2006.01)
(Continued)

(52) U.S. Cl.
CPC .............. *H04B 1/18* (2013.01); *H03F 3/193* (2013.01); *H03F 3/195* (2013.01); *H04B 1/0007* (2013.01);
(Continued)

(58) Field of Classification Search
CPC ............ H04B 7/0695; H04B 10/07955; H04B 7/0617; H04B 17/318; H04B 1/02;
(Continued)

(56) References Cited

U.S. PATENT DOCUMENTS

| 6,765,536 B2 | 7/2004 | Phillips et al. |
| 6,987,493 B2 | 1/2006 | Chen |

(Continued)

FOREIGN PATENT DOCUMENTS

WO    WO 2017/161347    9/2017

*Primary Examiner* — Ajibola A Akinyemi
(74) *Attorney, Agent, or Firm* — Dority & Manning, P.A.

(57) ABSTRACT

Example aspects of the present disclosure are directed to front end modules for use in communication systems. In one example aspect, a front end module can include a receive path. The receive path can include a low noise amplifier. The receive path can include an analog to digital converter (ADC) circuit operable to receive an analog signal from the low noise amplifier and convert the analog signal to a digital RF receive signal. The receive path can include an ADC post processing circuit operable to process the digital RF receive signal in the digital domain. The front end module can include a transmit path. The transmit path can include a digital to analog converter circuit operable to convert the digital RF transmit signal to an analog RF transmit signal. The transmit path can include a power amplifier.

11 Claims, 5 Drawing Sheets

Related U.S. Application Data (60) Provisional application No. 62/528,393, filed on Jul. 3, 2017.

(51) Int. Cl.
*H03F 3/195* (2006.01)
*H04B 1/44* (2006.01)
*H04B 1/00* (2006.01)
*H04B 1/48* (2006.01)
*H04B 1/04* (2006.01)
*H03M 1/00* (2006.01)

(52) U.S. Cl.
CPC .............. *H04B 1/44* (2013.01); *H04B 1/48* (2013.01); *H03F 2200/294* (2013.01); *H03F 2200/372* (2013.01); *H03F 2200/451* (2013.01); *H03M 1/00* (2013.01); *H04B 1/0475* (2013.01)

(58) Field of Classification Search
CPC .... H04B 1/16; H04B 7/0408; H04B 10/0705; H04B 10/071; H04B 10/0775; H04B 10/503; H04B 10/85; H04B 17/309; H04B 1/0067; H04B 1/38; H04B 1/40; H04B 7/0452; H04B 7/088

USPC ...................................................... 455/193.1
See application file for complete search history.

(56) References Cited

U.S. PATENT DOCUMENTS

| | | | |
|---|---|---|---|
| 7,068,234 | B2 | 6/2006 | Sievenpiper |
| 7,215,289 | B2 | 5/2007 | Harano |
| 7,830,320 | B2 | 11/2010 | Shamblin |
| 7,911,402 | B2 | 3/2011 | Rowson et al. |
| 8,362,962 | B2 | 1/2013 | Rowson et al. |
| 8,446,318 | B2 | 5/2013 | Ali et al. |
| 8,570,231 | B2 | 10/2013 | Desclos et al. |
| 8,648,755 | B2 | 2/2014 | Rowson et al. |
| 8,717,241 | B2 | 5/2014 | Shamblin et al. |
| 9,240,634 | B2 | 1/2016 | Rowson et al. |
| 9,439,151 | B2 | 9/2016 | Zhu et al. |
| 2003/0179831 | A1* | 9/2003 | Gupta ................... H03F 1/3294 375/296 |
| 2015/0171925 | A1* | 6/2015 | Ling ..................... H04B 5/0031 455/41.1 |
| 2015/0200795 | A1* | 7/2015 | Ramesh ............ H04L 25/03343 375/296 |
| 2016/0049966 | A1* | 2/2016 | Wang ....................... H04B 1/40 455/561 |
| 2016/0337979 | A1* | 11/2016 | Talty .................. H04W 52/0274 |
| 2017/0005677 | A1* | 1/2017 | Petrovic ................ H03F 1/0222 |

* cited by examiner

EFFICIENT FRONT END MODULE

PRIORITY CLAIM

The present application is a continuation of U.S. patent application Ser. No. 16/021,299, titled "Efficient Front End Module," filed on Jun. 28, 2018, which claims the benefit of priority of U.S. Provisional Patent Application Ser. No. 62/528,393, titled "Efficient Front End Module," filed on Jul. 3, 2017, which is incorporated herein by reference.

FIELD

The present disclosure relates generally to front end modules for radio frequency (RF) communication systems.

BACKGROUND

The large amounts of data consumed in various environments can strain wireless communication systems, such as Wi-Fi wireless systems. Along with Wi-Fi based internet usage for emails and web viewing, video streaming is gaining in popularity. Multiple occupants in a typical home can require high speed, high data rate connectivity to multiple viewing screens including TV consoles, smartphones, laptops, tablets, and other devices. For wireless connectivity throughout the home, Wi-Fi has become the system of choice, and the 5 GHz band has become a standard for high data rate streaming and video services. The Wi-Fi protocol has continued to progress, for instance, from the 802.11b,g configuration up to, for instance, 802.11ax protocol. Depending on the country and region that the Wi-Fi system is operating, there can be in excess of 800 MHz of frequency spectrum to span in the 5 GHz band. This large bandwidth brings the benefit of high data rates due to available bandwidth and the difficulties of designing RF/digital communication systems to service this bandwidth efficiently. With multiple data and streaming users to service in the home, frequency and time domain techniques can be implemented to improve connectivity to the multiple users at diverse locations throughout the home. Variable bandwidths can and have been implemented in the Wi-Fi protocol to provide a dynamic method of altering data rates at the expense of radio modem complexity.

The RF FEM (Front-End Module) has continued to grow in complexity along with the tuner architecture to keep up with these increasing and variable bandwidth requirements. An RF FEM can be configured provide transmit and receive functions and bridge the antenna system to the rest of the transceiver/baseband sub-system. An RF FEM may contain a low-noise amplifier (LNA) and power amplifier (PA) along with switching to connect transmit and receive paths to a common antenna.

SUMMARY

Aspects and advantages of embodiments of the present disclosure will be set forth in part in the following description, or may be learned from the description, or may be learned through practice of the embodiments.

One example aspect of the present disclosure is directed to a front end module. The front end module can include a receive path. The receive path can include a low noise amplifier operable to receive an RF signal from an antenna. The receive path can include an analog to digital converter (ADC) circuit operable to receive an analog signal from the low noise amplifier and convert the analog signal to a digital RF receive signal. The receive path can include an ADC post processing circuit operable to process the digital RF receive signal in the digital domain. The receive path can include a digital down converter circuit operable to convert the digital RF receive signal to a digital baseband receive signal. The front end module can include a transmit path. The transmit path can include a digital up converter circuit operable to convert the digital baseband transmit signal to a digital RF transmit signal. The transmit path can include a digital to analog converter circuit operable to convert the digital RF transmit signal to an analog RF transmit signal. The transmit path can include a power amplifier configured to provide the analog RF transmit signal to the antenna.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to RF front end modules (FEM) for use in RF systems. An RF FEM can be connected to a modem sub-system to modulate and demodulate the RF signal. On a receive path, the demodulated signal can be digitized to allow for signal processing and other processes to be applied to the information. On a transmit path, a digital signal can be converted to a modulated RF signal in preparation for radiating from the antenna system into the propagation channel. This demarcation between RF and digital signals in the RF FEM and modem is a common architecture used in communication systems. Several drawbacks and limitations of this FEM architecture can include the need for an FEM per antenna in the communication system and the need for a complex tuner when a variable bandwidth is required. Additional complexity to the FEM configuration can be required when features such as envelope tracking and automatic gain control are implemented and coordination between the baseband processor and the FEM is needed to configure (e.g., optimize) these processes.

According to example embodiments of the present disclosure, an FEM (e.g., an FEM for use in Wi-Fi applications) can include an analog to digital converter (ADC) circuit and/or digital to analog converter (DAC) circuit to provide for digital signal processing of RF signals in the digital domain at the FEM. In some embodiments, the FEM can include a multi-channel gigabit ADC circuit in a receive path of the FEM. The gigabit ADC circuit can be located, for instance, in the FEM in the receive path right after a low noise amplifier (LNA). The ADC circuit can directly sample the receive signal in the receive path to allow for digital processing of the receive signal (e.g., filtering, down converting to base band, calibrating, etc.). This digital processing can be implemented in the digital domain at the FEM before providing the signals to the digital baseband circuit.

In some embodiments, a similar digital processing domain can be implemented in a transmit path of the FEM. For instance, a transmit signal can be processed and up-converted to RF in the digital domain before being converted to analog using a gigabit DAC circuit. In the transmit path of 5 GHz Wi-Fi applications, this architecture can provide instantaneous access to approximately the entire band (e.g., about 1 GHz) in contrast to commonly used architectures that only provide narrower band channels (e.g., 20, 40, 80 or 160 MHz band channels) through a fine-tuned mixer.

FEMs according to example embodiments of the present disclosure can provide a number of technical effects and benefits. For example, FEMs according to example embodiments of the present disclosure can reduce a need to replicate the analog baseband (ABB) portions of RF circuits for every antenna element by using a multi-channel gigabit ADC structure (e.g., by time sharing the ADC modules). This architecture reduces the need for an RF FEM per antenna.

As another example, FEMs according to example embodiments of the present disclosure can reduce the requirement for mixed-signal gain calibration in the transmit path by implementing calibration in the digital domain at the FEM before providing the signal to the baseband processor. As another example, FEMs according to example embodiments of the present disclosure can provide digital pre-distortion (DPD) processing and envelope tracking fully within the FEM boundary without having to perform these processes in conjunction with the baseband processor As yet another example, the transmit path of an FEM can access approximately the entire about 800 MHz to about 1 GHz of frequency spectrum to span for different Wi-Fi applications (e.g., about 4.9 GHz to about 5.9 GHz) in the 5 GHz band. This can lead to an increase in spectrum efficiency for the FEMs.

As another example, system scheduler intelligence can be enabled by approximately full band capture to provide for dynamic frequency selection (DFS) capabilities. For instance, the ability to sense emissions across approximately the entire band can allow for immediate and continuous identification of a radar channel. As a result, radar detection and mitigation as part of DFS can be accomplished in real-time or near real time without impact to throughput.

As yet another example, in some embodiments, FEMs can accommodate clear channel assessment (CCA) for per station channel allocation to reduce throughput efficiencies by allowing for management of the entire spectrum by the Wi-Fi access point. The FEMs according to example embodiments can provide for load balancing of groups across channels in the FEM.

As yet another example, FEMs according to example embodiments of the present disclosure can reduce gain requirements of the power amplifier (PA) in the transmit path. This can help with PA linearity and efficiency. As a result, modulation schemes with a higher number of constellation points can be used to accommodate more advanced wireless standards.

One example embodiment of the present disclosure is directed to a front end module. The front end module can include a receive path. The receive path can include a low noise amplifier operable to receive an RF signal from an antenna. The receive path can include an analog to digital converter (ADC) circuit operable to receive an analog signal from the low noise amplifier and convert the analog signal to a digital RF receive signal. The receive path can include an ADC post processing circuit operable to process the digital RF receive signal in the digital domain. The receive path can include a digital down converter circuit operable to convert the digital RF receive signal to a digital baseband receive signal. The front end module can include a transmit path. The transmit path can include a digital up converter circuit operable to convert the digital baseband transmit signal to a digital RF transmit signal. The transmit path can include a digital to analog converter circuit operable to convert the digital RF transmit signal to an analog RF transmit signal. The transmit path can include a power amplifier configured to provide the analog RF transmit signal to the antenna.

In some embodiments, the ADC circuit is operable to convert analog RF signals across a span of about 800 MHz or greater in the 5 GHz band. In some embodiments, the ADC circuit is a gigabit ADC circuit.

In some embodiments, the DAC circuit is operable to provide digital to analog conversion of signals across a span of 800 MHz or greater in the 5 GHz band. In some embodiments, the DAC circuit is a gigabit DAC circuit.

In some embodiments, the ADC post processing circuit is configured to process the digital RF signal in the digital domain to provide one or more of phase adjustment, amplitude adjustment, or jitter cancellation. In some embodiments, the transmit path includes a pre-distortion processing circuit configured to process the digital baseband transmit signals to pre-compensate for non-linearity of the power amplifier.

In some embodiments, the front end module includes an envelope tracker configured to control power delivery to the power amplifier. In some embodiments, the front end module includes a calibration engine operable to control one or more gains associated with the low noise amplifier.

In some embodiments, the ADC circuit includes a multi-channel ADC circuit having M discrete ADC circuits, the receive path comprising a multiplexer circuit configured to distribute a plurality of N inputs among the M discrete ADC circuits. In some embodiments, each of the N inputs can be associated with a different low noise amplifier of a plurality of low noise amplifiers. In some embodiments, each of the plurality of low noise amplifiers can be associated with a different antenna of a plurality of antennas.

In some embodiments, the DAC circuit includes a multi-channel DAC circuit having M discrete DAC circuits. The transmit path can include a multiplexer circuit configured to distribute a plurality of N inputs among the M discrete DAC circuits. In some embodiments, each of the M discrete DAC is associated with a different power amplifier of a plurality of power amplifiers. In some embodiments, each of the plurality of power amplifiers is associated with a different antenna of a plurality of antennas.

In some embodiments, the antenna can include a modal antenna operable in a plurality of different modes. Each mode can be associated with a different radiation pattern and/or polarization state. The front end module can include an active element configured to control one or more electrical characteristics associated with a parasitic element for the modal antenna to configure the modal antenna in one of the plurality of different modes.

Another example embodiment of the present disclosure is directed to a front end module having a transmit path. The transmit path can include a pre-distortion processing circuit configured to process one or more digital baseband transmit signals to pre-compensate for non-linearity of a power amplifier. The transmit path can includes a digital up converter circuit operable to convert the digital baseband transmit signal to a digital RF transmit signal. The transmit path can include a digital to analog converter (DAC) circuit operable to convert the digital RF transmit signal to an analog RF transmit signal. The transmit path can include a DAC post processing circuit is configured to process the analog RF transmit signal to provide phase adjustment, amplitude adjustment, or jitter cancellation. The DAC circuit can be operable for digital to analog conversion of signals across a span of 800 MHz or greater in the 5 GHz band.

In some embodiments, the DAC circuit includes a multi-channel DAC circuit having M discrete DAC circuits. The transmit path can include a multiplexer circuit configured to distribute a plurality of N inputs among the M discrete DAC circuits.

Another example embodiment of the present disclosure is directed to a front end module having a receive path. The receive path includes a low noise amplifier operable to receive an RF signal from an antenna. The receive path includes an analog to digital conversion (ADC) circuit operable to receive an analog signal from the low noise amplifier and convert the analog signal to a digital RE receive signal. The receive path includes an ADC post processing circuit operable to process the digital RF receive signal in the digital domain to provide phase adjustment, amplitude adjustment, or jitter cancellation. The receive path includes a digital down converter circuit operable to convert the digital RF receive signal to a digital baseband receive signal. The ADC circuit can be operable to convert analog RF signals across a span of about 800 MHz or greater in the 5 GHz band.

As used herein, the use of the term "about" in conjunction with a numerical value refers to within 20% of the stated numerical value and including the stated numerical value. The use of the term "module" in conjunction with "Front End Module" is not intended to invoke interpretation under 35 U.S.C. 112(f).

Figure 1:
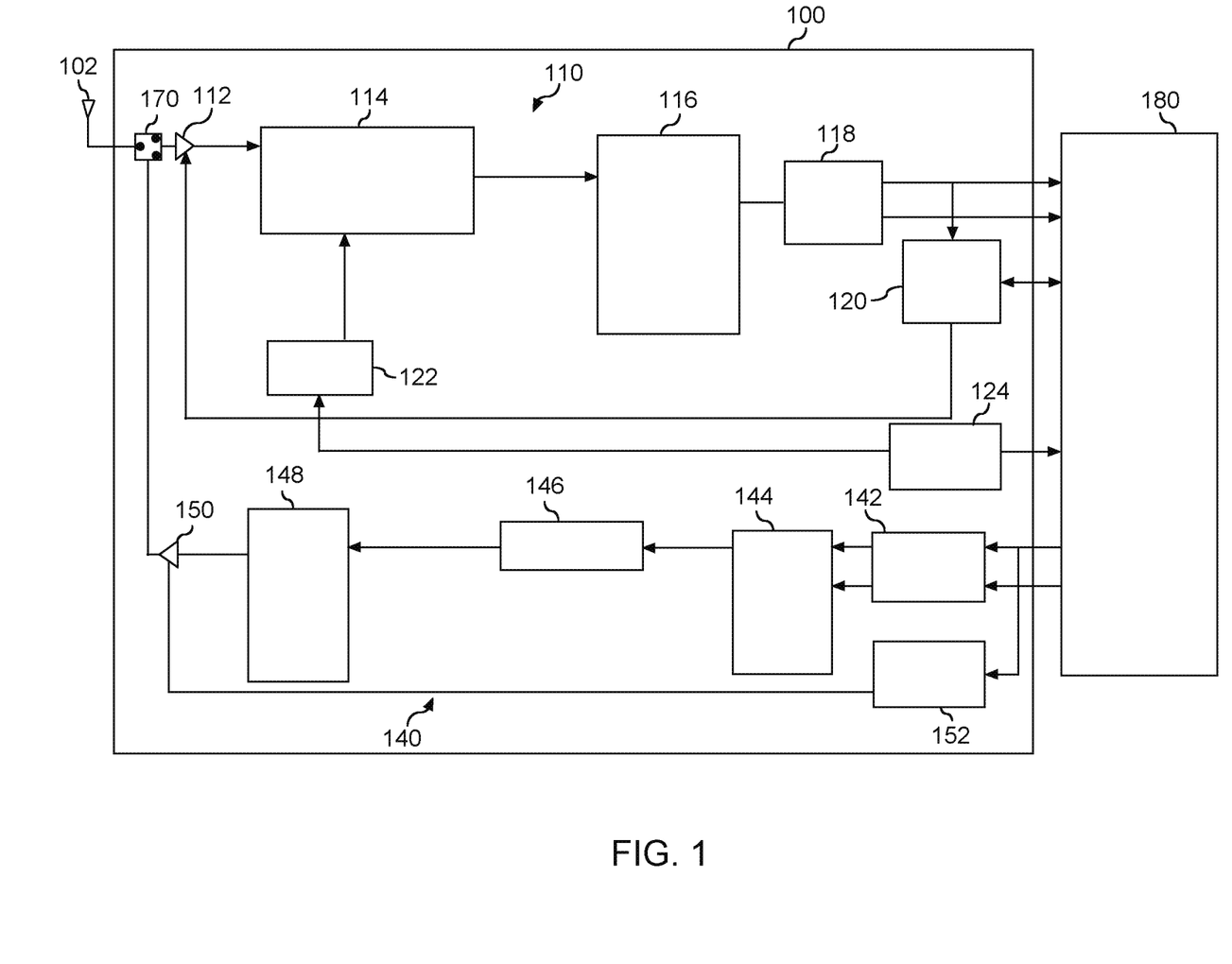
FIG. 1 depicts an example front end module according to example embodiments of the present disclosure.

FIG. 1 depicts an example FEM 100 according to example embodiments of the present disclosure. The FEM 100 can be coupled to an antenna 102. The antenna 102 can be any suitable antenna for RF communications. In some embodiments, the antenna 102 is adapted for communicating in a Wi-Fi RF system. For instance, the antenna 102 can be adapted for wide band communication in the 5 GHz band (e.g., about 4.9 GHz to about 5.9 GHz).

Aspects of the present disclosure are discussed with reference to Wi-Fi RF communication systems. Those of ordinary skill in the art, using the disclosures provided herein, will understand that FEMs according to example embodiments of the present disclosure can be used in other wide band applications.

The FEM 100 can be implemented as an integrated circuit. The FEM 100 can include a receive path 110 and a transmit path 140. The receive path 110 can be configured to process RF signals received at antenna 102 and provide the received RF signals to a baseband processor 180. In some embodiments, the baseband processor 180 can be implemented as a separate integrated circuit relative to the FEM 100.

The transmit path 140 can be configured to process signals from the baseband processor 180 for transmission by antenna 102 to remote devices. The FEM can include a switch 170. The switch 170 can be configured to selectively couple the receive path 110 and the transmit path 140 to the antenna 102 to receive and transmit RF signals.

The receive path 110 can include a low noise amplifier (LNA) 112. The LNA 112 can be coupled to antenna 102 via switch 170. The LNA 112 can be coupled to one switch port of switch 170 and can receive analog RF receive signals from the antenna 102.

After amplification, the LNA 112 can provide an analog RF receive signal to an analog to digital converter (ADC) circuit 114. The ADC circuit 114 can be a gigabit ADC circuit or multi-gigabit ADC circuit. The ADC circuit 114 can sample the RF receive signal and convert the RF receive signal to a digital RF receive signal having one or more bits. The ADC circuit 114 can sample at a high rate to provide, for instance, a digital RF receive signal with a resolution sufficient to accommodate the 5 GHz band for Wi-Fi applications. The ADC circuit can be configured to convert RF analog signals across a wide frequency band. For instance, the ADC circuit 114 can be configured to convert analog RF receive signals across approximately the entire frequency spectrum of a Wi-Fi band (e.g., 4.9 GHz to 5.9 GHz).

The receive path 110 can include one or more ADC post processing circuits 116 configured to receive the digital RF receive signal from the ADC circuit 114. The ADC post processing circuit(s) 116 can be configured to process the digital RF receive signal in the digital domain to implement one or more functions. For instance, in some embodiments, the ADC post processing circuit(s) 116 can implement a digital filter to filter the digital RF receive signal. In some embodiments, the ADC post processing circuit(s) 116 can implement phase and/or amplitude adjustments to the digital RF receive signal. In some embodiments, the ADC post processing circuit(s) 116 can implement jitter cancellation in the digital domain by processing the digital RF receive signal. The ADC post processing circuit(s) 116 can implement other processing operations on the digital RF receive signal in the digital domain.

After post processing, the receive path 110 can provide the processed digital RF receive signal to a downsampling circuit 118. The downsampling circuit 118 can downsample the digital RF signal to a digital baseband receive signal for communication to a baseband processor 180. In some embodiments, the digital baseband receive signal can have a resolution that is less than a resolution of the digital RF receive signal.

The receive path 110 can include a calibration engine 120. The calibration engine 120 can be one or more processing circuits configured to implement logic to control various aspects of the FEM 100. For instance, the calibration engine 120 can, for instance, control gain of the LNA 112 based on signals from the baseband processor 180.

The receive path 110 can also include an ADC controller circuit 122. The ADC controller circuit 122 can implement logic to control the sampling of the ADC circuit 114 to convert the analog RF receive signal from the LNA 112 to the digital RF receive signal. The ADC controller circuit 122 can receive a clock signal from an oscillator 124. The oscillator 124 can be, for instance, a crystal oscillator. The ADC controller circuit 122 can control sampling of the ADC circuit 114 based on the clock frequency. The oscillator 124 can also provide a clock signal to the baseband processor 180.

The transmit path 140 can receive digital baseband transmit signals from the baseband processor 180. The transmit path 140 can include a digital pre-distortion processing circuit 142 configured to process the digital baseband transmit signals, for instance, to pre-compensate for any non-linearity of power amplifiers used in the transmit path 140.

The digital baseband transmit signal can be provided to an upsampling circuit 144. The upsampling circuit 144 can upsample the digital baseband transmit signal to a digital RF transmit signal for a digital to analog converter (DAC) circuit 146. The digital RF transmit signal can have a higher resolution than the digital baseband transmit signal.

The DAC circuit 146 can be capable of converting the digital RF transmit signal to an analog RF transmit signal. The DAC circuit 146 can be a gigabit DAC circuit or multi-gigabit DAC circuit. The DAC circuit 146 can be capable of wide band digital to analog conversion. For instance, the DAC circuit 146 can be configured to convert digital signal to analog signals across approximately the entire Wi-Fi band (e.g., 4.9 GHz to 5.9 GHz).

The transmit path 140 can include a DAC post processing circuit 148 configured to process the analog RF signals prior to providing the analog RF signals to a power amplifier 150. The DAC post processing circuit(s) 148 can be configured to process the analog RF transmit signal in the analog domain to implement one or more functions. For instance, in some embodiments, the DAC post processing circuit(s) 148 can implement a filter to filter the analog RF transmit signal. In some embodiments, the DAC post processing circuit(s) 148 can implement phase and/or amplitude adjustments to the analog RF transmit signal. In some embodiments, the DAC post processing circuit 148 can implement jitter cancellation in the analog domain by processing the analog RF transmit signal. The DAC post processing circuit(s) 148 can implement other processing operations on the analog RF transmit signal.

The analog RF transmit signal can be provided to a power amplifier 150. The power amplifier can amplify the RF transmit signal and communicate the signal via switch 170 to antenna 102 for communication to one or more remote devices.

An envelope tracker 152 can be implemented as part of the FEM 100. The envelope tracker 152 can assess information from the baseband transmit signal and control power supplied to the PA 150 to increase operating efficiency of the PA 150. The envelope tracker 152 can be implemented as part of the FEM 100 outside of the baseband processor 180.

Figure 2:
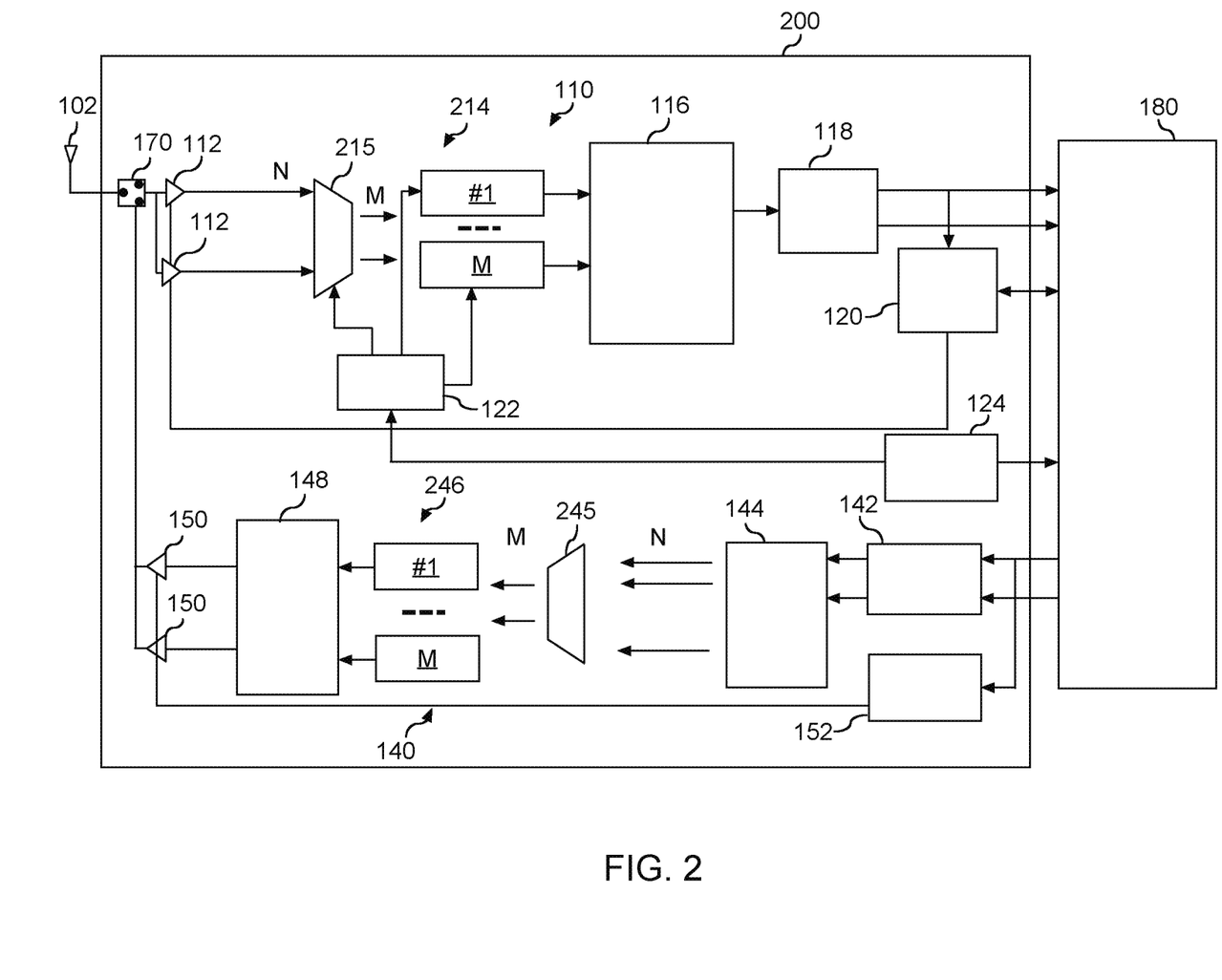
FIG. 2 depicts an example front end module according to example embodiments of the present disclosure.

FIG. 2 depicts a FEM module 200 according to example embodiments of the present disclosure. The FEM module 200 is similar to that of FIG. 1. However, the FEM module 200 includes a multi-channel ADC circuit 214 in the receive path. The multi-channel ADC circuit 214 can have M number of ADC circuits, each to accommodate RF signals received from a different antenna and/or a different LNA. In some embodiments, each of the M ADC circuits in the multi-channel ADC circuit 214 can accommodate different bands within a wide band capable of being accommodated by the FEM 200. For instance, each of the M ADC circuits in the multi-channel ADC circuit 214 can accommodate a discrete frequency span with the overall frequency span of about 800 MHz to about 1 GHz associated with the 5 GHz Wi-Fi band.

A multiplexing circuit 215 can be used to control the distribution of analog RF signals among the individual ADC circuits in the multi-channel ADC circuit 214. For instance, the multiplexing circuit 215 can receive N inputs from N different LNAs 112. In some embodiments, the ratio of N inputs to M ADC circuits can be 1:1. In some embodiments, the number of N inputs can be greater than the number of M ADC circuits. In some embodiments, the number of N inputs can be less than the number of M ADC circuits. The multiplexing circuit 215 can be controlled (e.g., by ADC controller circuit 122) to distribute the N RF inputs among the M ADC circuits in the multi-channel ADC circuit 214.

In FIG. 2, each of the N inputs to the multiplexing circuit 215 can be associated with a different LNA 112 of a plurality of LNAs 112. Each LNA 112 can be coupled to a single antenna 102. Each LNA 112 can be associated with a different frequency span in the overall wide band accommodated by the FEM 200.

Figure 3:
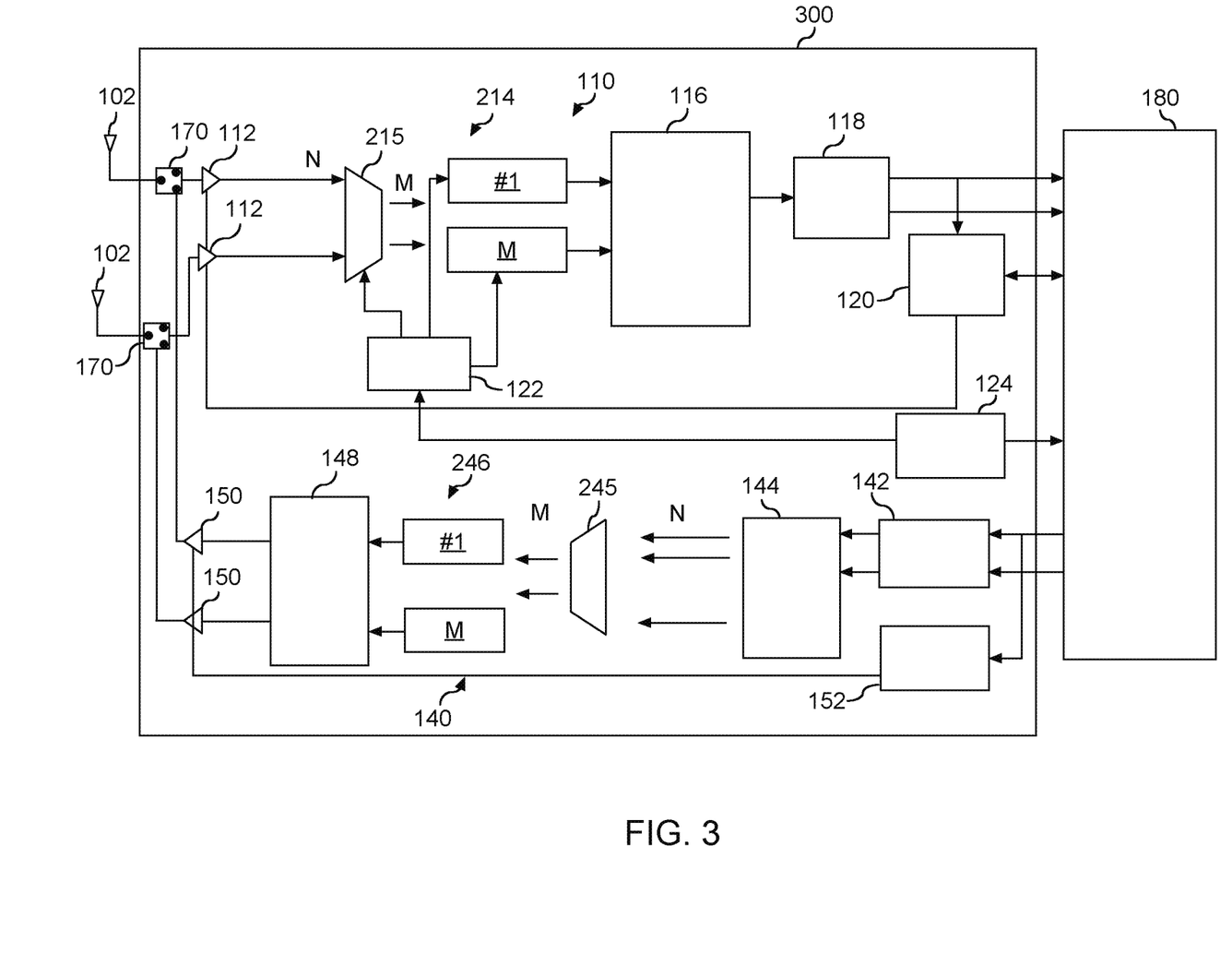
FIG. 3 depicts an example front end module according to example embodiments of the present disclosure.

FIG. 3 depicts an example FEM 300 configured to accommodate RF communication using a plurality of antennas 102. The FEM 300 is similar to that of FIG. 2. More particularly, each of the N inputs to the multiplexing circuit 215 can be associated with a different LNA 112 of a plurality of LNAs 112. In FIG. 3, however, each LNA 112 is coupled to a different antenna 102 of a plurality of antennas 102.

Referring back to FIG. 2, the FEM 200 can include a multi-channel DAC circuit 246 in the transmit path 140. The multi-channel DAC circuit 246 can have M number of DAC circuits, each to accommodate RF signals for a different antenna and/or a different PA. In some embodiments, each of the M DAC circuits in the multi-channel DAC circuit 246 can accommodate different bands within a wide band capable of being accommodated by the FEM 200. For instance, each of the M DAC circuits in the multi-channel DAC circuit 246 can accommodate a discrete frequency span with the overall frequency span of about 800 MHz to 1 GHz associated with the 5 GHz Wi-Fi band.

A multiplexing circuit 245 can be used to control the distribution of digital RF transmit signals among the individual DAC circuits in the multi-channel DAC circuit 246. For instance, the multiplexing circuit 245 can receive N inputs from the upsampling circuit 144. In some embodiments, the ratio of N inputs to M DAC circuits can be 1:1. In some embodiments, the number of N inputs can be greater than the number of M DAC circuits. In some embodiments, the number of N inputs can be less than the number of M DAC circuits.

In FIG. 2, each of the M DAC circuits in the multi-channel DAC circuit 246 can be associated with a different PA 150 of a plurality of PAs 152. Each PA 150 can be coupled to a single antenna 102. Each PA 150 can be associated with a different frequency span in the overall wide band accommodated by the FEM 200.

FIG. 3 depicts an example FEM 300 configured to accommodate RF communication using a plurality of antennas 102. The FEM 300 is similar to that of FIG. 2. More particularly, each of the M DAC circuits can be associated with a different PA 150 of a plurality of PAs 150. In FIG. 3, however, each PA 150 is coupled to a different antenna 102 of a plurality of antennas 102.

In some embodiments, the full band data capture process can be improved in terms of signal transmission and reception in the propagation channel by implementing and controlling a modal antenna system from the FEM. A modal antenna can be configurable in one of a plurality of different modes. Each mode can be associated with a different radiation pattern and/or polarization state for the antenna. In some embodiments, the modal antenna can include a radiating element and one or more parasitic elements. The modal antenna can be configured in one of a plurality of modes by controlling electrical characteristics of the parasitic elements.

For instance, in some embodiments a modal antenna can include a parasitic element coupled to a switch or other active element. The switch or other actively controlled element be used to selectively couple the parasitic element to ground, to a voltage source, or to varying different reactance. As a result, control of the parasitic element via the switch or other active element can configure the modal antenna in one of a plurality of different modes. One example modal antenna is described with reference to FIGS. 5-7 below.

Figure 4:
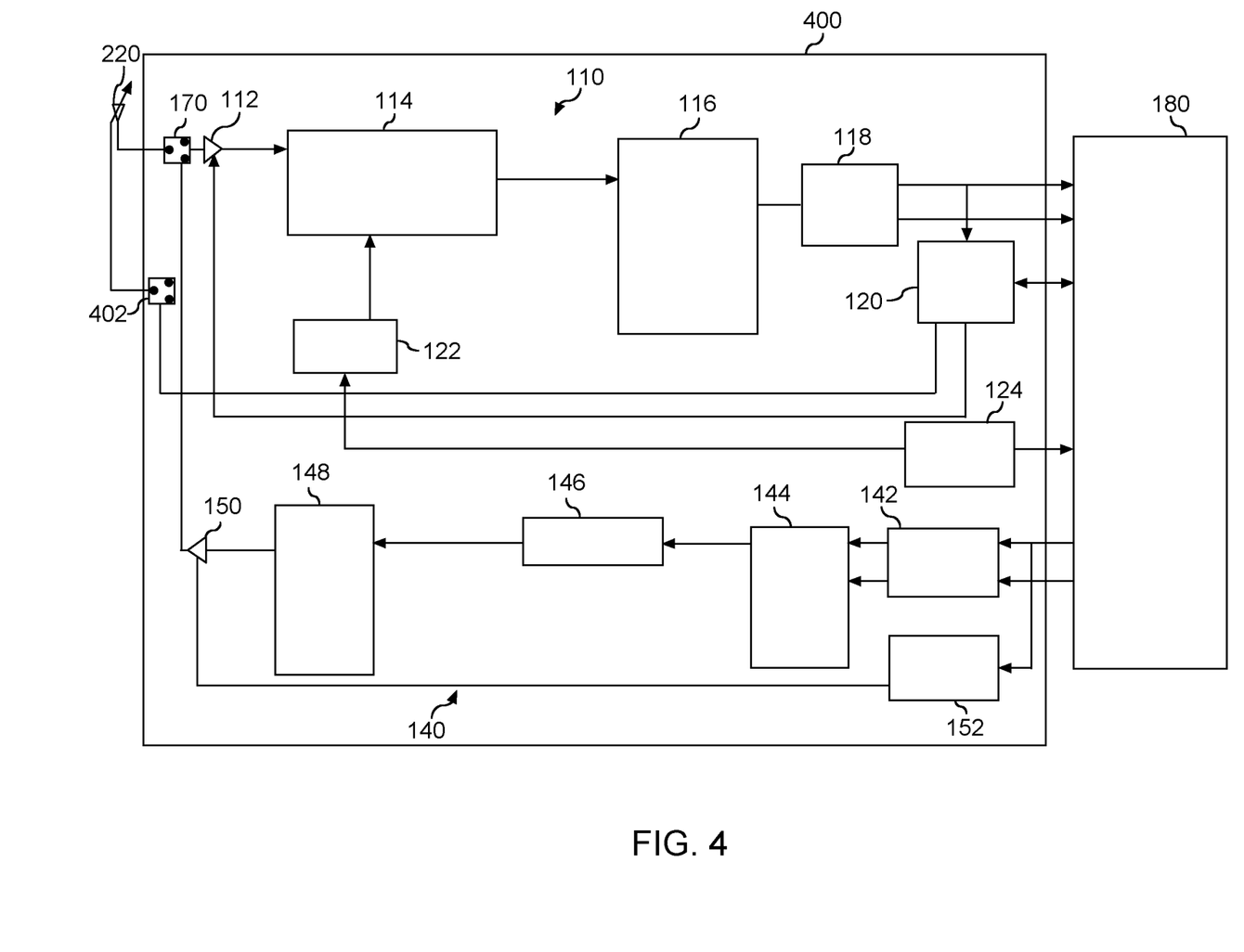
FIG. 4 depicts an example front end module according to example embodiments of the present disclosure.

FIG. 4 depicts an example FEM 400 configured to accommodate a modal antenna 220 according to example embodiments of the present disclosure. The FEM 400 is similar to that shown in FIG. 1. The FEM 400 can additionally include an active element 402 (e.g., four-port switch) coupled to a parasitic element of the antenna 102. The active element 402 can be controlled to adjust the parasitic element to configure the antenna 102 in one of a plurality of modes, with each mode having a distinct radiation pattern and/or polarization state.

The FEM 400 can further include logic (e.g. instructions executed by one or more processing circuits) configured to control the active element 402. The logic can control the active element 402 to configure the antenna 102 in one of a plurality of modes. In the embodiment of FIG. 4, the logic can be implemented as part of the calibration circuit 122. However, the logic can be implement as its own circuit or component within FEM or as part of different components of the FEM without deviating from the scope of the present disclosure.

In some embodiments, the logic can receive signals from, for instance, the baseband processor indicative of channel quality index (CQI). The CQI can include or can be based on metrics such as signal-to-noise ratio (SNR), signal to interference-plus-noise ratio (SINR), receive signal strength indicator (RSSI), bit error rate (BER) and/or other metrics. The logic can implement a control routine that selects a mode for operating the modal antenna based on the CQI (e.g., to reduce interference, to implement active steering of radiation patterns, etc.).

In some embodiments, the logic can be implemented as part of the calibration engine 120. The logic can be implemented as a separate component or as part of a different component of the FEM 400 without deviating from the scope of the present disclosure.

Figure 5:
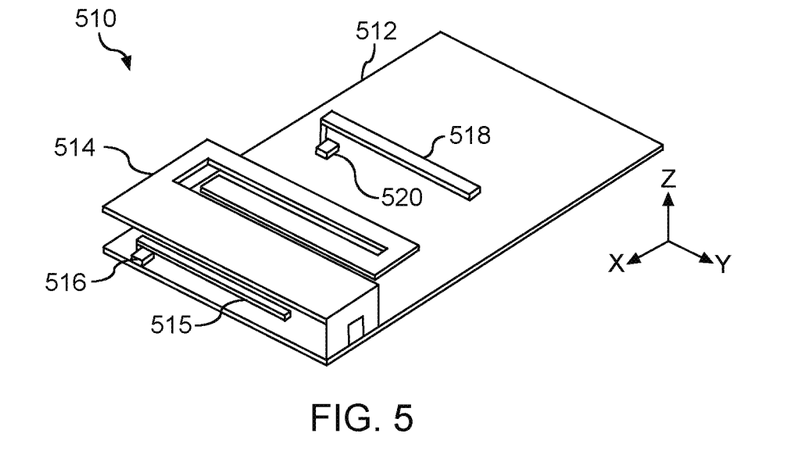
FIGS. 5, 6 and 7 depict aspects of an example modal antenna according to example embodiments of the present disclosure.

FIG. 5 illustrates an example embodiment of a modal antenna 510 that can be used in accordance with aspects of the present disclosure. The modal antenna 510 may include a circuit board 512 (e.g., including a ground plane) and a driven antenna element 514 disposed on the circuit board 512. An antenna volume may be defined between the circuit board (e.g., and the ground plane) and the driven antenna element.

In some embodiments, a first parasitic element 515 may be positioned at least partially within the antenna volume. A first active element 516 may be coupled with the parasitic element 515. The first active tuning element 516 can be a passive or active component or series of components and may be configured to alter a reactance on the first parasitic element 515 either by way of a variable reactance, or shorting to ground, resulting in a frequency shift of the antenna. As discussed above, the first active element 516 can be implemented as part of a front end module according to example embodiments of the present disclosure.

In some embodiments, a second parasitic element 518 may be disposed proximate the circuit board 512 and may be positioned outside of the antenna volume. The second parasitic element 518 may further include a second active element 520 which may individually include one or more active and/or passive components. The second active element 520 can be a passive or active component or series of components and may be configured to alter a reactance on the second parasitic element 518 either by way of a variable reactance or shorting to ground, resulting in a frequency shift of the antenna. As discussed above, the second active element 520 can be implemented as part of a front end module according to example embodiments of the present disclosure. The second parasitic element 518 may be positioned adjacent the driven element 514 and may also be positioned outside of the antenna volume.

The described configuration may provide an ability to shift the radiation pattern characteristics of the driven antenna element by varying a reactance thereon. Shifting the antenna radiation pattern can be referred to as "beam steering". In instances where the antenna radiation pattern comprises a null, a similar operation can be referred to as "null steering" since the null can be shifted to an alternative position about the antenna (e.g., to reduce interference). In some embodiments, the second active element 520 may include a switch for connecting the second parasitic to ground when "On" and for terminating the short when "Off". It should however be noted that a variable reactance on either of the first or second parasitic elements, for example by using a variable capacitor or other tunable component, may further provide a variable shifting of the antenna pattern or the frequency response. For example, the first active element 916 and/or second active element 520 may include at least one of a tunable capacitor, MEMS device, tunable inductor, switch, a tunable phase shifter, a field-effect transistor, or a diode.

Figure 6:
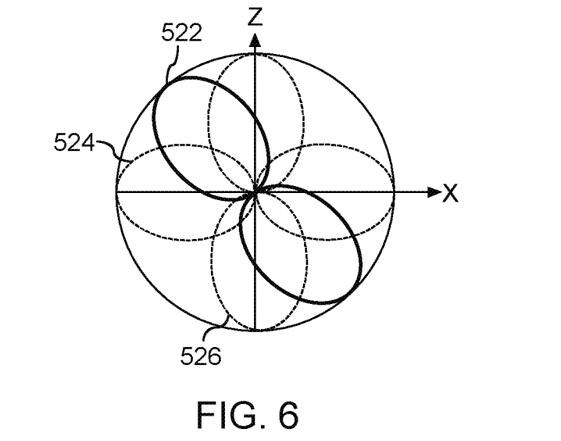

FIG. 6 illustrates a two-dimensional antenna radiation pattern associated with the modal antenna of FIG. 5. The radiation pattern may be shifted by controlling an electrical characteristic associated with at least one of the first and/or second parasitic elements 515, 518 of the modal antenna 510. For example, in some embodiments, the radiation pattern may be shifted from a first mode 522 to a second mode 524, or a third mode 526.

Figure 7:
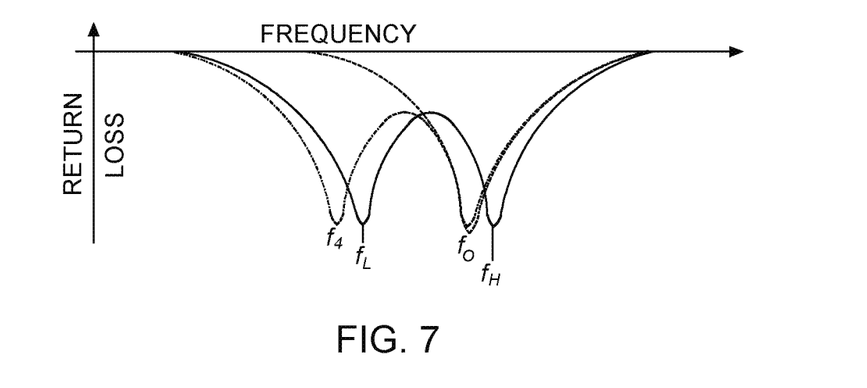

FIG. 7 illustrates an example frequency plot of the modal antenna of FIG. 5 according to example aspects of the present disclosure. The frequency of the antenna can be shifted by controlling an electrical characteristic associated with at least one of the first and/or second parasitic elements 515, 518 of the modal antenna 510. For example, a first frequency ($f_0$) of the antenna may be achieved when the first and second parasitic elements are switched "Off"; the frequencies ($f_L$) and ($f_H$) may be produced when the second parasitic is shorted to ground; and the frequencies ($f_4$; $f_0$) may be produced when the first and second parasitic elements are each shorted to ground. It should be understood that other configurations are possible within the scope of this disclosure. For example, more or fewer parasitic elements may be employed. The positioning of the parasitic elements may be altered to achieve additional modes that may exhibit different frequencies and/or combinations of frequencies.

FIGS. 5-7 depict one example modal antenna having a plurality of modes for purposes of illustration and discussion. Those of ordinary skill in the art, using the disclosures provided herein, will understand that other modal antennas and/or antenna configurations can be used without deviating from the scope of the present disclosure. As used herein, a "modal antenna" refers to an antenna capable of operating in a plurality of modes where each mode is associated with a distinct radiation pattern and/or polarization state. Example modal antennas are described in U.S. Pat. Nos. 9,748,637; 9,240,634; 8,648,755; 8,362,962; and 7,911,402, which are incorporated herein by reference.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A front end module comprising:
   a receive path defined between a baseband processor and one or more antennas when the front end module is coupled to the baseband processor and the one or more antennas, the receive path comprising one or more low noise amplifiers, the receive path configured to receive analog RF receive signals across a span of about 800 MHz or greater in a 5 GHz band from the one or more low noise amplifiers and convert the analog RF receive signals to digital RF receive signals for post processing in a digital domain, wherein the receive path further comprises:
      an analog to digital converter (ADC) circuit operable to receive the analog RF receive signals from the one or more low noise amplifiers and to convert the analog RF receive signals to the digital RF receive signals;
      an ADC post processing circuit operable to process the digital RF receive signals in the digital domain; and
      a digital down converter circuit operable to convert the digital RF receive signals to digital baseband receive signals;
   wherein the front end module further comprises a transmit path defined between the baseband processor and the one or more antennas when the front end module is coupled to the baseband processor and the one or more antennas, the transmit path comprising one or more power amplifiers, the transmit path operable to convert digital RF transmit signals to analog RF transmit signals across a span of about 800 MHz or greater in the 5 GHz band and to provide the analog RF transmit signals to the one or more power amplifiers, wherein the transmit path further comprises:
      a digital up converter circuit operable to convert digital baseband transmit signals to the digital RF transmit signals;
      a digital to analog converter circuit operable to convert the digital RF transmit signals to the analog RF transmit signals;
      a pre-distortion processing circuit configured to process the digital baseband transmit signals prior to conversion by the digital up converter circuit to precompensate for non-linearity of the power amplifier; and
      a digital to analog post processing circuit configured to process the analog RF transmit signals to provide phase adjustment, amplitude adjustment, or jitter cancellation, the digital to analog post processing circuit further configured to provide the processed analog RF signals to the one or more power amplifiers.

2. The front end module of claim 1, wherein the front end module further comprises an envelope tracker configured to control power delivery to the one or more power amplifiers.

3. The front end module of claim 1, wherein the front end module further comprises a calibration engine operable to control one or more gains associated with the one or more low noise amplifiers.

4. The front end module of claim 1, wherein the front end module is coupled to an antenna, the antenna comprising a modal antenna operable in a plurality of different modes, each mode associated with a different radiation pattern.

5. The front end module of claim 4, wherein the front end module comprises an active element configured to control one or more electrical characteristics associated with a parasitic element for the modal antenna.

6. A front end module having a receive path, the receive path comprising:
   a low noise amplifier operable to receive an RF signal from an antenna;
   an analog to digital conversion (ADC) circuit operable to receive an analog signal from the low noise amplifier and convert the analog signal to a digital RF receive signal;
   a digital down converter circuit operable to convert the digital RF receive signal to a digital baseband receive signal; and
   an ADC post processing circuit coupled between the ADC circuit and the digital down converter circuit, the ADC post processing circuit operable to process the digital RF receive signal in a digital domain to provide phase adjustment, amplitude adjustment, or jitter cancellation prior to the digital RF receive signal being converted to the digital baseband receive signal by the digital down converter circuit;
   wherein the ADC circuit is operable to convert analog RF signals across a span of about 800 MHz or greater in a 5 GHz band.

7. The front end module of claim 6, wherein the ADC circuit comprises a multi-channel ADC circuit having a M discrete ADC circuits, the receive path further comprising a multiplexer circuit configured to distribute a plurality of N inputs among the M discrete ADC circuits.

8. The front end module of claim 6, wherein the front end module further comprises a calibration engine operable to control one or more gains associated with the low noise amplifier.

9. The front end module of claim 6, wherein the front end module is coupled to an antenna, the antenna comprising a modal antenna operable in a plurality of different modes, each mode associated with a different radiation pattern or polarization state.

10. The front end module of claim 9, wherein the front end module comprises an active element configured to control one or more electrical characteristics associated with a parasitic element for the modal antenna.

11. The front end module of claim 6, wherein when the front end module is coupled to a baseband processor and one or more antennas, the receive path of the front end module is defined between the baseband processor and the one or more antennas.

* * * * *